(12) United States Patent
Smith

(10) Patent No.: US 6,429,643 B1
(45) Date of Patent: *Aug. 6, 2002

(54) DEVICE FOR MEASURING POWER USING SWITCHABLE IMPEDANCE

(75) Inventor: Richard T. Smith, Hollywood Park, TX (US)

(73) Assignee: Southwest Research Institute, San Antonio, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/685,652

(22) Filed: Oct. 10, 2000

Related U.S. Application Data

(63) Continuation-in-part of application No. 09/112,039, filed on Jul. 8, 1998, now Pat. No. 6,147,484.

(51) Int. Cl.$^7$ ............................................... G01R 11/32
(52) U.S. Cl. ..................................... 324/142; 324/103 R
(58) Field of Search ............................... 324/142, 141, 324/113, 115, 116, 114, 103 R; 702/60, 61, 62, 57

(56) References Cited

U.S. PATENT DOCUMENTS

| | | | |
|---|---|---|---|
| 4,120,031 A | 10/1978 | Kincheloe et al. | 324/113 |
| 4,401,943 A | 8/1983 | Morris | 324/115 |
| 4,814,996 A | 3/1989 | Wang | 324/142 |
| 4,977,515 A | 12/1990 | Rudden et al. | 340/825.07 |
| 5,315,236 A | 5/1994 | Lee | 324/103 R |
| 5,869,960 A | 2/1999 | Brand | 324/142 |
| 6,147,484 A | * 11/2000 | Smith | 324/142 |

* cited by examiner

Primary Examiner—Vinh P. Nguyen
(74) Attorney, Agent, or Firm—Baker Botts L.L.P.

(57) ABSTRACT

A device for measuring power, or other circuit parameters, of an alternating current load. The device has an ammeter and voltmeter for measuring voltage across the load and current through the load. The device also has a known impedance element that is switchably connected across the load. The ammeter is used to provide a second current measurement with the impedance so connected. These measurements, together with the known impedance value, are used to calculate power, the power factor, impedance, or some other parameter associated with the load. The same device may also be implemented circuitry that is the "dual" of that described above, such that voltage rather than current measurements are used.

29 Claims, 3 Drawing Sheets

DEVICE FOR MEASURING POWER USING SWITCHABLE IMPEDANCE

RELATED APPLICATIONS

This application is a continuation-in-part application of application Ser. No. 09/112,039 filed Jul. 8, 1998, entitled, Power Measurement Device, now U.S. Pat. No. 6,147,484.

TECHNICAL FIELD OF THE INVENTION

This invention relates to electric measuring devices, and more particularly to a device for determining the power usage of an alternating current load.

BACKGROUND OF THE INVENTION

Measurement of electrical circuit parameters, such as voltage, current, resistance, and power, is often required for monitoring a circuit for normal operation or for localizing a fault in the circuit. Many different types of instruments, varying over a wide range of price and complexity, are available to measure one or more of these parameters directly or to derive them from other measurements.

The simplest measurement devices are meters, which may be configured to measure voltage, current, resistance, or some combination of these parameters. An example of an ohmmeter is based on a d'Arsonval meter circuit, which consists of a meter in series with a battery and variable resistor. The meter has a pointer that moves in a manner proportional to current. The ohmmeter is calibrated by adjusting the variable resistor to show a zero resistance reading. Then when an unknown resistance is connected, the meter reflects the unknown resistance.

Digital multimeters combine a voltmeter, ammeter, and ohmmeter in a single device. The internal circuits of the multimeter convert the selected input variable to a dc voltage that is proportional to the measured value for the input variable. This dc voltage is converted to digital form and a numerical value is displayed.

Power has conventionally been measured with a wattmeter. A typical wattmeter has a pair of fixed current coils and a moveable coil. The current coils are in series with the load and have the same line current. The moveable coil is across the load and carries a needle that moves over a scale. Field strength of the current coils is proportional to the line current and in phase with it. The moveable coil produces a flux that is dependent on voltage. Because the force acting on the moveable coil is proportional to the time average of the product of the line current and the voltage, the needle deflection is proportional to power.

Other circuit parameters, such as impedance and reactance, may be derived from measured values. Various techniques for calculating these parameters are known in the art of circuit analysis.

SUMMARY OF THE INVENTION

One aspect of the invention is a device for measuring power parameters of an alternating current load, such as power and the power factor. An ammeter is connected in series with the load, and a voltmeter is connected across the load. A known impedance is also connected across the load in parallel with the voltmeter. The known impedance is switchable in and out of the circuit formed by the ammeter and voltmeter. The device also has means for connecting the circuit to an alternating voltage supply. A processor receives a voltage measurement from the voltmeter, a first current measurement from the ammeter when the known impedance is out of circuit, and a second current measurement from the ammeter when the known impedance is in circuit. The processor is programmed to use these measurements and the known impedance value to calculate the power usage of the load, the power factor, or both. A user interface has a display that displays the calculated value(s).

An advantage of the invention is that it provides a simple inexpensive alternative to a conventional wattmeter. It can be designed as a small compact device, convenient for measuring power consumed by any ac load. It is useful for measuring "power pollution", such as that resulting from appliances and other consumer electronics that continue to consume power even while turned off.

The power measurement provided by the device is a "true" ac power measurement. It is not simply the product of an ac voltage and an ac current, such as might be provided with a multimeter.

DETAILED DESCRIPTION OF THE INVENTION

Voltage Source Supplying Unknown Load

Figure 1:
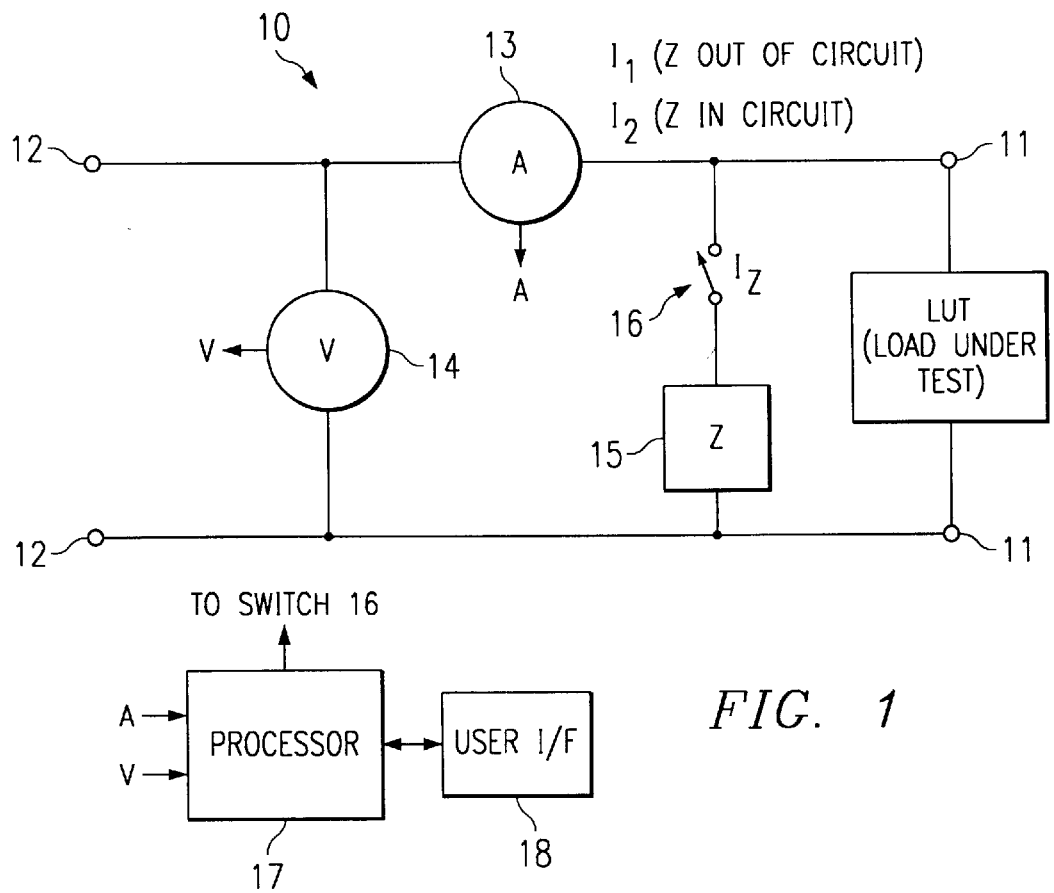
FIG. 1 is a block diagram of a power measurement device in accordance with the invention.

FIG. 1 is a block diagram of a power measuring device 10 in accordance with the invention. The load whose power is to be measured is connected between the load terminals 11 of device 10. The load under test (LUT) may be any load that operates on single phase alternating current. It may have any unknown impedance.

Power terminals 12 may be connected to any single phase ac power supply. As explained below in connection with FIG. 4, in one embodiment of the invention, power terminals 12 are connected to a standard household electrical outlet.

The basic elements of device 10 are an ammeter 13, voltmeter 14, a known impedance 15, a processor 17, and a user interface 18.

Ammeter 13 is connected in series with the LUT. Voltmeter 14 and impedance 15 are in parallel with each other, and are both connected across the LUT. Ammeter 13 and voltmeter 14 may be conventional electrical measuring circuits for measuring rms ac voltage and current. Ammeter 13 may be connected by conductive or inductive means.

Impedance 15 may be any type of impedance. For purposes of this description, impedance may be expressed as a complex number (rectangular form):

$$Z = R + jX,$$

where $j = \sqrt{-1}$, or in terms of its magnitude and phase (polar form):

$$Z = Z_{magnitude} \angle \theta$$

As explained below, for simplicity of design and operation, impedance 15 will typically be either a resistor, Z=R, or capacitor, Z=1/jωC. However, impedance 15 could also be an inductor, Z=jωL, or any combination of these three elements.

Impedance 15 is switchable in and out of circuit 10 by means of switch 16. Switch 16 may be any type of switching device. It may be manually operated or automatically controlled by processor 17.

Processor 17 receives current and voltage measurements from ammeter 13 and voltmeter 14, respectively. It has appropriate signal processing and analog-to-digital conversion circuitry for providing digital data representing these measured values. Processor 17 performs the various calculations explained below and has appropriate memory and programming for performing these calculations.

A user interface 18 can be designed with varying levels of user features. In its simplest form, it has at least a digital display that displays the power usage of the LUT.

In operation, the LUT is connected to terminals 11 and an ac power source is connected to terminals 12. The following rms measurements are obtained and provided to processor 17:

V $I_1$ $I_2$ where $I_1$ is the current through ammeter 13 with switch 16 open and $I_2$ is the current through ammeter 13 with switch 16 closed. Processor 17 receives appropriate signals from ammeter 13 and voltmeter 14, and performs digital conversions and calculations to provide the above listed parameters. Because Z is known, $I_Z$, the current through Z, is calculated as V/Z, where V is the phasor V∠0.

Figure 2:
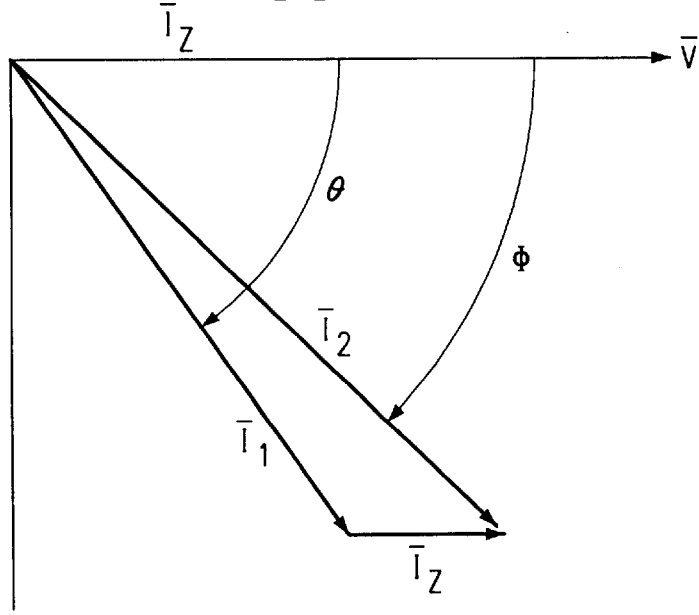
FIG. 2 is a phasor diagram of the circuit of FIG. 1 when the known impedance is a resistor.

FIG. 2 illustrates a phasor representation of circuit 10, where Z is a resistor, such that Z=R with no reactance component. Thus, the current through impedance 15, $\bar{I}_Z$, is in phase with the applied voltage, $\bar{V}$. $\bar{I}_1$ is of known magnitude but unknown phase angle θ; $\bar{I}_2$ is of known magnitude but unknown phase angle Φ.

The value of cos θ is the power factor, conventionally defined as the cosine of the phase angle between the applied voltage and circuit current. It may also be defined as the ratio of the true power of an ac circuit to the apparent power.

The power factor, cos θ, may be expressed trigonometrically as follows:

$$\cos\theta = \frac{1}{2\, I_z I_1}(I_2^2 - I_1^2 - I_z^2)$$

where the current values are magnitude values and are measured, or, in the case of $I_z$, calculated. The above equation can now be solved for cos θ.

By conventional definition, the power parameters of the unknown load are:

PF (load power factor)=cos θ

$P_{load}$ (load power)=cos θ V $I_1$ $Z_{load}$ (load impedance)=V/$I_1$ ∠θ

Thus, the above parameters are calculated from measured values. By substitution, $$P_{load} = \frac{V}{2\, I_z}(I_2^2 - I_1^2 - I_z^2)$$

Although the phasor diagram is used herein for illustrative purposes, cos θ and hence power are derived from measured values and from the calculated value of $I_Z$. There is no need to determine phasor angles. As explained below, even where Z is not simply a resistor, cos θ can be calculated from measured rms values and the known impedance Z.

Figure 3:
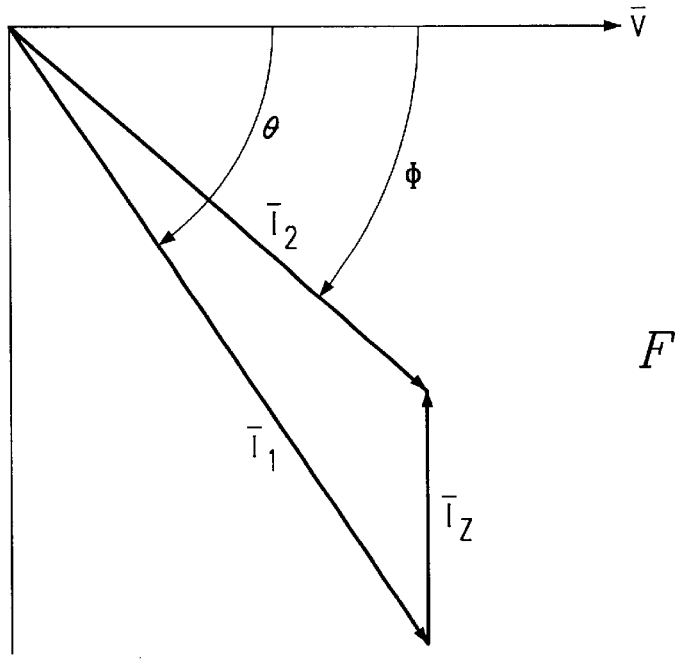
FIG. 3 is a phasor diagram of the circuit of FIG. 1 when the known impedance is a capacitor.

FIG. 3 illustrates a phasor representation of device 10 where Z is a capacitor, C. Thus, the current through Z, $I_Z$, is 90 degrees out of phase with the applied voltage, V. For this configuration of device 10, sin θ may be expressed trigonometrically as follows:

$$\sin\theta = \frac{1}{2\, I_1 I_z}(I_1^2 - I_z^2 - I_2^2)$$

Again, the power factor and the load power can be determined from measured values, where PF (load power factor)=cos θ

$P_{load}$ (load power)=cos θ V $I_1$

Figure 4:
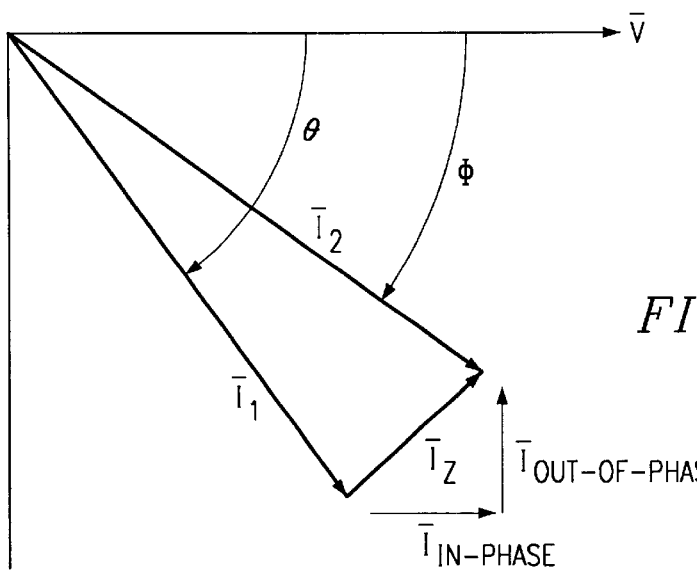
FIG. 4 is a phasor diagram of the circuit of FIG. 1 when the known impedance is any known value of R+jX.

FIG. 4 illustrates how the same concepts can be extended for an impedance 15 having any value Z=R+jX. The in-phase and out-of-phase components of $I_Z$ are expressed as $I_{Inphase}$ and $I_{out-of-phase}$ respectively. $I_{out-of-phase}$ is taken as positive for capacitive impedance, and negative for inductive impedance.

By trigonometry:

$I_2 \cos \phi = I_1 \cos \theta + I_{in-phase}$     (a)

$I_1 \sin \theta = I_2 \sin \phi + I_{out-of-phase}$     (b)

Equation (a) may be rewritten as:

$\cos \phi = (I_1/I_2)\cos \theta + I_{in-phase}/I_2$     (c)

and Equation (b) may be rewritten as:

$\sin \phi = (I_1/I_2)\sin \theta - I_{out-of-phase}/I_2$     (d)

For convenience, the following notations may be substituted into Equations (c) and (d):

$\alpha = I_1/I_2$ $\beta = I_{in}/I_2$ $\gamma = I_{out}/I_2$ and Equations (c) and (d) may be rewritten as:

$\cos \phi = \alpha \cos \theta + \beta$     (e)

$\sin \phi = \alpha \sin \theta - \gamma$     (f)

The following two equations are equivalent to Equations (e) and (f), respectively, derived by squaring both sides of the equations (e) and (f):

$\cos^2 \phi = \alpha^2 \cos^2 \theta + 2\alpha\beta\cos \theta + \beta^2$     (g)

$\sin^2 \phi = \alpha^2 \sin^2 \theta - 2\alpha\gamma\sin \theta + \gamma^2$     (h)

Equations (g) and (h) may be added to obtain the following:

$1 = \alpha^2 + \beta^2 + \gamma^2 + 2\alpha(\beta \cos \theta - \gamma \sin \theta)$     (i)

This equation can now be solved for cos θ.

A general trigonometric identity is:

$$\beta \cos\theta - \gamma \sin\theta = \sqrt{\beta^2+\gamma^2} \cos[\theta+\tan^{-1}\gamma/\beta]$$

Now Equation (i) can be rewritten as:

$$1=\alpha^2+\beta^2+\gamma^2+2\alpha(\beta^2+\gamma^2)^{1/2} \cos(\theta+\tan^{-1}\gamma/\beta)$$

or equivalently as:

$$\cos(\theta+\tan^{-1}\gamma/\beta) = \frac{1-\alpha^2-\beta^2-\gamma^2}{2\alpha(\beta^2+\gamma^2)^{1/2}}$$

where the values on the right hand side of the equation are magnitudes obtained from measurements of $I_1$ and $I_2$ and from calculated components of $I_Z$. Thus, $\cos\theta$ can be calculated.

The general case reduces to the special cases, where Z is pure resistance or pure capacitance. In the case of pure resistance, $\gamma=0$; whereas in the case of pure capacitance, $\beta=0$ and $\gamma$ is a positive number. In the case of pure inductance, $\gamma$ is a negative number.

As stated above, processor 17 is programmed to receive the measured voltage and current values. Depending on the type of impedance 15, it uses one of the above equations to determine the steady state average power consumed by the LUT. It provides this value to user interface 18, and may also provide other values such as load impedance, the power factor, load current, and load voltage. User interface 18 has a readout, typically a digital LED, to display these values. User interface 18 could also provide means for manual or automatic range switching for loads of different magnitudes.

From the above discussion, it is clear that the power measured by device 10 is a "true power" measurement in the sense that it is not simply the product of ac voltage and current. Thus, device 10 provides a measure of power not provided by a device having a voltage meter and ammeter whose outputs are multiplied.

Figure 5:
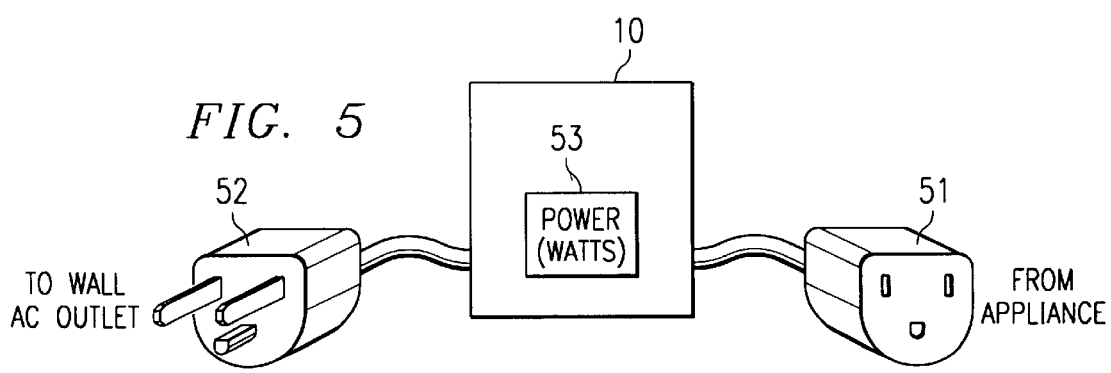
FIG. 5 illustrates the device of FIG. 1 configured for measuring power usage of consumer equipment powered from a conventional ac wall outlet.

FIG. 5 illustrates an application of the invention for consumer use for measuring power of various household appliances or other electronic devices. The power measurement device 10 has a female connector 51 for receiving a conventional plug of a power cord. It also has a male connector 52 for connection to a wall outlet. In operation, meter 10 is connected between the appliance and the wall outlet. The power consumed by the appliance in its "on" or "off" state can be determined by means of a readout 53. The invention is also useful for today's appliances and other electronic devices that are increasing equipped with "standby" or other reduced power modes.

Current Source Supplying Unknown Load

Figure 6:
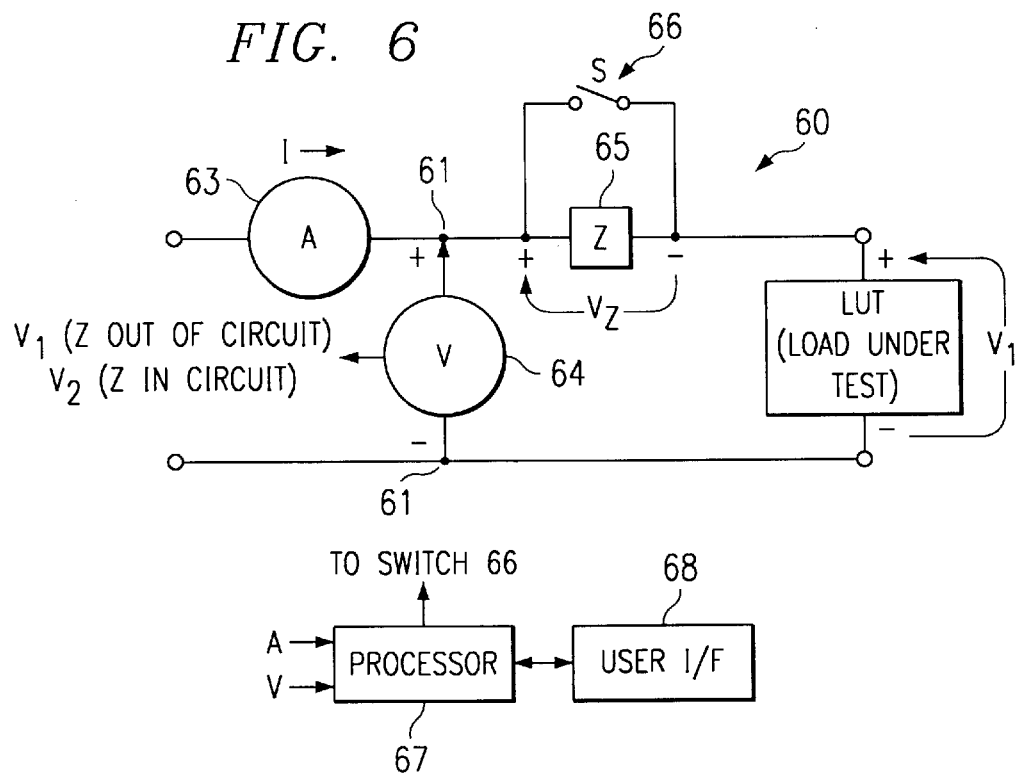
FIG. 6 illustrates an alternative embodiment of the power measurement device.

FIG. 6 illustrates an alterative embodiment of the invention, a power measuring device 60 that is the electronic dual of the embodiment of FIG. 1. Device 60 is appropriately used with a load under test that is supplied with a current source (I) 63. The known impedance (Z) 65 is connected in series with the load under test. Switch (S) 66 permits the impedance 65 to be effectively removed from the circuit.

During power measurement, switch 66 is first opened and the voltage V is recorded as $V_2$. Then switch 66 is closed and V is recorded as $V_1$. These two rms voltages and the rms magnitude, I, of the current source are supplied to processor 67. Voltage $V_Z$ is calculated as IZ, where Z is known and I is the phasor I at angle 0.

Figure 7:
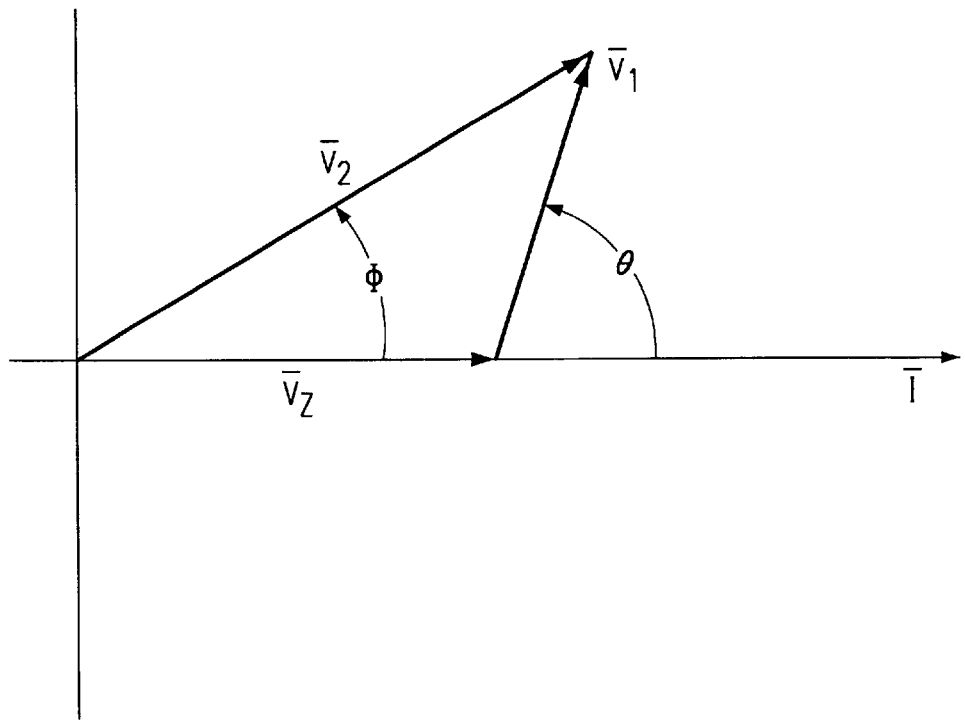
FIG. 7 is a phasor diagram of the circuit of FIG. 6 when the known impedance is a resistor.

FIG. 7 illustrates the phasor relationships among the three voltages and the current when Z is purely resistive. The power factor $\cos\theta$ may be expressed as follows:

$$\cos\theta = \frac{1}{2\,V_Z V_1}(V_2^2 - V_1^2 - V_Z^2)$$

and $P_{load}=\cos\theta I V_1$.

Device 60 is the electronic dual of device 10. Thus, with the interchange of symbols V and I, the equations and explanations set out above for device 10 apply to device 60. The known impedance is in series with the load, rather than in parallel. A switch is in parallel with the known impedance, rather than in series. The switch is normally closed except when measuring power, rather than normally open. Two measured voltages and a current provide input to a processor, rather than two measured currents and a voltage.

Manually Connected Power Measurement Device for Home Use

The above described power measurement devices 10 and 60 are especially useful as "permanent" meters that may be installed in circuit with an associated load under test and used for continuous or periodic monitoring. Such devices can be installed without the need to connect and disconnect the measurement circuit.

Alternatively, both device 10 and device 60 could be easily used as portable meters, in the sense that they can be manually connected to any load when desired. All needed components, including the switching function and known impedance, are incorporated into these devices so that they can be connected by 52 to the supply and by 51 to the load, as shown in FIG. 5.

Manually Connected Power Measurement Device for Lab Use

Power measurement devices 10 and 60 could also be easily adapted for use as a lab or "bench" type meter. The switching function of switch 16 and 66 could be performed manually. It follows that switch 16 or 66 could be eliminated entirely, and the known impedance could be manually connected and disconnected to obtain the above-desired measurements. Device 10 or 60 would have leads at terminals 11 or 61 for providing such a connection.

For example, the connection of device 10 or 60 could be accomplished manually, using electrical leads or probes, by a user who desires to determine the power usage of a particular electricity consuming device of interest at that time. The device would be powered by the alternating power supply of the load itself as shown in FIGS. 1 and 6.

Other Embodiments

Although the present invention has been described in detail, it should be understood that various changes, substitutions, and alterations can be made hereto without departing from the spirit and scope of the invention as defined by the appended claims.

What is claimed is:

1. A method of measuring power usage of an alternating current load, comprising the steps of:

providing said alternating current to said load;
   connecting a voltmeter, an ammeter, and the load, such that the voltmeter is operable to measure voltage across the load and the ammeter is operable to measure current through the load;
   measuring the voltage value across said load;
   measuring a first current value through the load;
   connecting a known impedance in parallel with the load;
   measuring a second current value through the parallel combination of the known impedance and the load; and
   calculating at least one power parameter of said load, using said voltage value, said first current value, said second current value, and said known impedance value.

2. The method of claim 1, wherein said known impedance is one or more resistors.

3. The method of claim 1, wherein said known impedance is one or more capacitors.

4. The method of claim 1, wherein said known impedance is a combination of resistive and reactive elements.

5. The method of claim 1, wherein said calculating step calculates power usage of said load.

6. The method of claim 1, wherein said calculating step calculates a power factor associated with said load.

7. The method of claim 1, wherein said step of providing an alternating current is performed by connecting said circuit to a conventional wall outlet.

8. A device for measuring power usage of an alternating current load, comprising:
- an ammeter operable to measure current from a current source;
- a known impedance switchably connected in series with said load, said known impedance having a known impedance value;
- a voltmeter operable to measure voltage across the series combination of the impedance and the load;
- a switch for switching said known impedance in and out of the circuit formed by said ammeter, said voltmeter, and said impedance;
- a processor operable to receive a current measurement from said ammeter, a first voltage measurement from said voltmeter when said known impedance is out of circuit, and a second voltage measurement from said voltmeter when said known impedance is in circuit, and programmed to use said measurements and said known impedance value to calculate one or more power parameter values of said load; and
- a user interface operable to provide a value representing at least one of said power parameters.

9. The device of claim 8, wherein said known impedance is one or more resistors.

10. The device of claim 8, wherein said known impedance is one or more capacitors.

11. The device of claim 8, wherein said known impedance is a combination of resistive and reactive elements.

12. The device of claim 8, wherein said processor calculates power usage of said load.

13. The device of claim 8, wherein said processor calculates a power factor associated with said load.

14. The device of claim 8, wherein said means for connecting said circuit to an alternating voltage supply is a conventional power cord plug.

15. The device of claim 8, wherein said circuit is connected to said load by means of a conventional power cord plug.

16. A method of measuring power usage of an alternating current load, comprising the steps of:
- providing said alternating current to said load;
- connecting a voltmeter, an ammeter, and the load, such that the voltmeter is operable to measure voltage across the load and the ammeter is operable to measure current through the load;
- measuring the current value through the load;
- measuring a first voltage value across the load;
- connecting a known impedance in series with the load;
- measuring a second voltage value across the series combination of the known impedance and the load; and
- calculating at least one power parameter of said load, using said current value, said first voltage value, said second voltage value, and said known impedance value.

17. The method of claim 16, wherein said known impedance is one or more resistors.

18. The method of claim 16, wherein said known impedance is one or more capacitors.

19. The method of claim 16, wherein said known impedance is a combination of resistive and reactive elements.

20. The method of claim 16, wherein said calculating step calculates power usage of said load.

21. The method of claim 16, wherein said calculating step calculates a power factor associated with said load.

22. The method of claim 16, wherein said step of providing an alternating current is performed by connecting said circuit to a conventional wall outlet.

23. A method of measuring power usage of an alternating current load, comprising the steps of:
- providing said alternating current to said load;
- connecting a voltmeter, an ammeter, and the load, such that the voltmeter is operable to measure voltage across the load and the ammeter is operable to measure current through the load;
- using a switch to connect a known impedance in series with the load, such that the known impedance may be placed in or out of the circuit formed by the voltmeter, ammeter, and the load;
- measuring the current value through the load;
- measuring a first voltage value across the load with the switch closed;
- measuring a second voltage value with the switch open, thereby measuring the second voltage across the series combination of the known impedance and the load; and
- calculating at least one power parameter of said load, using said current value, said first voltage value, said second voltage value, and said known impedance value.

24. The method of claim 23, wherein said known impedance is one or more resistors.

25. The method of claim 23, wherein said known impedance is one or more capacitors.

26. The method of claim 23, wherein said known impedance is a combination of resistive and reactive elements.

27. The method of claim 23, wherein said calculating step calculates power usage of said load.

28. The method of claim 23, wherein said calculating step calculates a power factor associated with said load.

29. The method of claim 23, wherein said step of providing an alternating current is performed by connecting said circuit to a conventional wall outlet.

* * * * *